United States Patent
Prajapati et al.

(10) Patent No.: US 8,471,432 B2
(45) Date of Patent: Jun. 25, 2013

(54) MAGNETOSTRICTIVE ACTUATOR

(75) Inventors: Kamlesh Prajapati, Beverley Yorkshire (GB); Neil Munns, Northfleet Kent (GB); Martin Geoffrey Aston, Market Weighton (GB); Christopher Tiler, Barnsley (GB)

(73) Assignee: FeONIC PLC, London (GB)

( * ) Notice: Subject to any disclaimer, the term of this patent is extended or adjusted under 35 U.S.C. 154(b) by 369 days.

(21) Appl. No.: 12/681,394

(22) PCT Filed: Jun. 26, 2008

(86) PCT No.: PCT/GB2008/050505
§ 371 (c)(1),
(2), (4) Date: Jun. 10, 2010

(87) PCT Pub. No.: WO2009/044180
PCT Pub. Date: Apr. 9, 2009

(65) Prior Publication Data
US 2010/0244622 A1  Sep. 30, 2010

(30) Foreign Application Priority Data
Oct. 3, 2007 (GB) .................................. 0719246.1

(51) Int. Cl.
H04R 15/00 (2006.01)
H01L 41/00 (2006.01)

(52) U.S. Cl.
USPC .............................. 310/300; 367/168; 310/26

(58) Field of Classification Search
USPC ..................... 310/300, 26; 367/168
See application file for complete search history.

(56) References Cited

U.S. PATENT DOCUMENTS

| 4,308,474 | A |   | 12/1981 | Savage et al. |
| 4,374,665 | A |   | 2/1983  | Koon |
| 4,609,402 | A |   | 9/1986  | McMasters |
| 4,849,034 | A |   | 7/1989  | Verhoeven et al. |
| 4,901,293 | A | * | 2/1990  | Kuhn ............................ 367/168 |
| 5,256,920 | A | * | 10/1993 | Porzio ............................ 310/13 |
| 5,406,153 | A | * | 4/1995  | Flatau et al. .................... 310/26 |
| 5,510,660 | A | * | 4/1996  | Flatau et al. .................... 310/26 |
| 5,706,254 | A | * | 1/1998  | Stahl ............................ 367/163 |
| 5,739,600 | A | * | 4/1998  | Kobayashi et al. ............. 310/26 |
| 6,891,286 | B2 * | 5/2005 | Flanagan et al. ................ 310/26 |
| 7,218,067 | B2 * | 5/2007 | Marioni ........................ 318/118 |
| 2006/0158063 | A1 |   | 7/2006 | Mori |

FOREIGN PATENT DOCUMENTS

| EP | 0251468 A  |   | 1/1988  |
| EP | 0283880 A  |   | 9/1988  |
| EP | 400497 A1  | * | 12/1990 |
| WO | 86/03888 A |   | 7/1986  |
| WO | 02/076141  |   | 9/2002  |

OTHER PUBLICATIONS

PCT Search Report dated Nov. 28, 2008 of Patent Application No. PCT/GB2008/050505 filed Jun. 26, 2008.

* cited by examiner

*Primary Examiner* — Tran Nguyen
*Assistant Examiner* — Alex W Mok
(74) *Attorney, Agent, or Firm* — Maine Cernota & Rardin

(57) ABSTRACT

A magnetostrictive actuator comprises an assembly of at least two GMM rods (8, 9) spaced apart from each other on the same longitudinal axis, each rod being surrounded by a respective energising electromagnetic coil (10,11) 5 and being mounted between respective biasing permanent magnets (12, 13, 14), the assembly being mounted between mechanical pre-stressing means (20, 21) and a foot (3) adapted to couple the forces produced by the actuator into a surface.

14 Claims, 2 Drawing Sheets

MAGNETOSTRICTIVE ACTUATOR

RELATED APPLICATIONS

This application is a 371(c) national stage application of PCT application no. PCT/GB2008/050505, filed 26 Jun. 2008, which claims priority to Great Britain application no. GB 0719246.1, filed 3 Oct. 2007, both of which are incorporated herein by reference in their entirety for all purposes.

FIELD OF THE INVENTION

This invention relates to a magnetostrictive actuator delivering improved output from small quantities of magnetostrictive material.

BACKGROUND TO THE INVENTION

Giant magnetostrictive materials (GMMs) are alloys of various rare earth and other metals with iron. Examples of such materials are described in U.S. Pat. No. 4,308,474, U.S. Pat. No. 4,374,665, U.S. Pat. No. 4,609,402 and U.S. Pat. No. 4,849,034. Early GMMs were developed principally for military applications, such as sonar, where considerations of power-consumption and cost were not the main design criteria. More recently, magnetostrictive actuators have been used for audio applications such as public address systems and portable personal audio systems (see for example WO02/076141) where low weight, cost and power consumption are important factors. The actuators are typically used to induce an audio signal into a surface, which can then radiate the signal, in effect acting as a loudspeaker. Actuators have been developed which contain small rods of GMM, for example of 10-15 mm in length and 2-5 mm diameter. These enable acceptable audio output to be achieved at a sufficiently low power consumption to permit satisfactory battery operation.

It is explained in WO02/076141 that it is desirable to achieve in a magnetostrictive actuator as near as possible a linear magnetic field through the length of the GMM rod. This may be achieved by biasing magnets at each end of the rod having a diameter substantially larger than that of the rod and preferably also by spacing the magnets from the ends of the rod by means of non-magnetic spacers. These requirements tend to limit the length of the rods which can be used, and while there is mention in WO02/076141 of the use of two or more pieces of GMM located end-to-end, in practice there may be little advantage in doing this, because the need to ensure a linear magnetic field imposes constraints on the length of GMM that can be used.

Since the change in length of the GMM rod in response to a change in magnetic field is a very small proportion of the length, the greater the length of the rod, the greater is the amplitude of vibration induced by the actuator into the surface. Thus, for improved audio quality at higher sound volume, it is desirable to use a longer rod.

These conflicting requirements limit the scope of designers to produce small, low-power magnetostrictive actuators that can produce high-quality sound.

SUMMARY OF THE INVENTION

It has now been found that improved audio performance can be achieved by providing a magnetostrictive actuator comprising an assembly of at least two GMM rods spaced apart from each other on the same longitudinal axis, each rod being surrounded by a respective energising electromagnetic coil and being mounted between respective biasing permanent magnets, the assembly being mounted between mechanical pre-stressing means and a foot adapted to couple the forces produced by the actuator into a surface.

A non-magnetic spacer may be located at each end of each rod between the rod and the adjacent biasing magnet, and the magnets are preferably chosen to be of substantially larger diameter than that of the rods, these factors helping to ensure that the magnetic field through each rod is as near linear as possible, while avoiding magnetic saturation of the rods.

While there is reference to the diameter of the rods, it will be appreciated that the rods do not need to be of circular cross-section; for example they may conveniently have a rectangular section, since they will typically be cut from a larger piece of GMM material, and the formation of a perfectly circular cross-section would merely be wasteful of material while offering no advantage to the performance of the actuator.

Typically, the rods will have a length of less than 20 mm for a low-power device operating from batteries, for example.

The coils will operate with the same frequency ranges and could therefore be connected in series, but parallel connection may be preferable for some applications. It may be desirable for each bobbin to carry more than one coil, each coil being optimised for a different frequency range, for example. Combinations of series and parallel connection may be employed with multiple coils on each bobbin, for example one coil from each bobbin being connected in series and the remaining coils being connected in parallel.

In one embodiment, wherein the end of the assembly engages a lever connected to the foot, whereby the forces may be applied by the foot in a direction oblique to, or at right-angles to, the said longitudinal axis. This configuration permits the actuator to be constructed in compact form.

The mechanical pre-stressing means may comprise a screw engaging the end of the assembly, and a common biasing magnet may be used between the or each adjacent pair of rods.

BRIEF DESCRIPTION OF THE DRAWINGS

In the drawings, which illustrate exemplary embodiments of the invention.

DETAILED DESCRIPTION OF THE ILLUSTRATED EMBODIMENT

Figure 1:
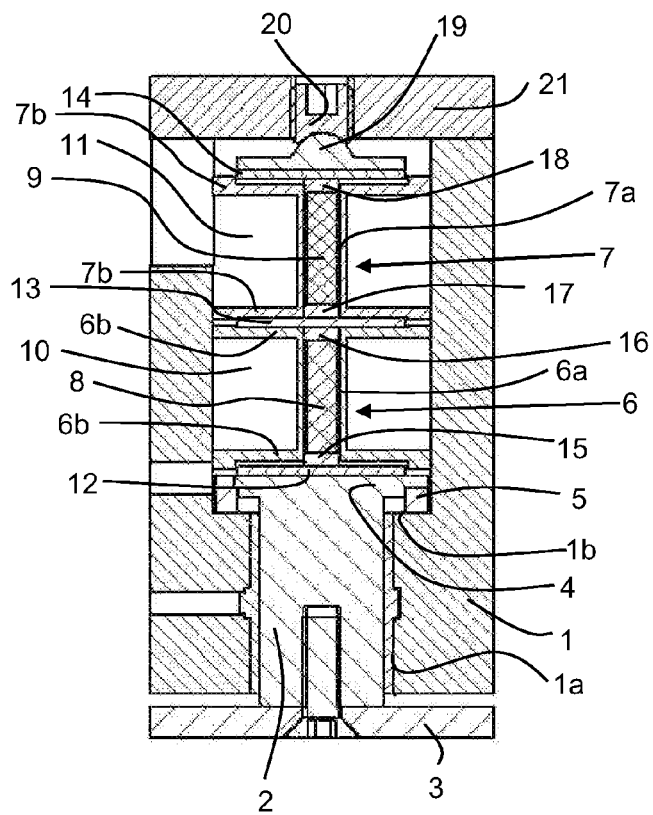
FIG. 1 is a cross-sectional elevation through an actuator according to a first embodiment.

Referring first to FIG. 1, the magnetostrictive actuator comprises a hollow cylindrical body 1 having mounted in narrower bore 1a at one end thereof a slidable plug or pusher 2, to which is secured a foot 3. The plug 2 has a flange 4 around the inner end thereof to retain it within the body, a flat spring 5 being interposed between the flange 4 and the shoulder 1b defined by the end of the narrower bore 1a.

A bobbin assembly is located on the upper end of the plug 2 and consists of a pair of plastics bobbins 6 and 7 each having a central cavity 6a and 7a in which a rod of GMM 8 and 9 respectively is slidably located. Each bobbin has a flange 6b, 7b at each end thereof to define an annular space in which is wound a signal coil 10, 11 for energising the GMM. Each bobbin flange 6b, 7b is formed with a recess in the outer face thereof, in which is received a disc magnet 12, 13 or 14. A non-magnet spacer 15, 16, 17 or 18 is interposed between the an end of the GMM rod 8 or 9 and the adjacent magnet. An end-piece 19 is located between the uppermost magnet 14 and an adjusting screw 20, which is in turn mounted in a threaded bore through an end plate 21 of the body 1, permitting the assembly to be mechanically pre-stressed to a desired degree.

Each of the coils 10 and 11 is provided with the same driving signal so that the forces generated by the GMM rods 8 and 9 are in phase and therefore added together.

Figure 2:
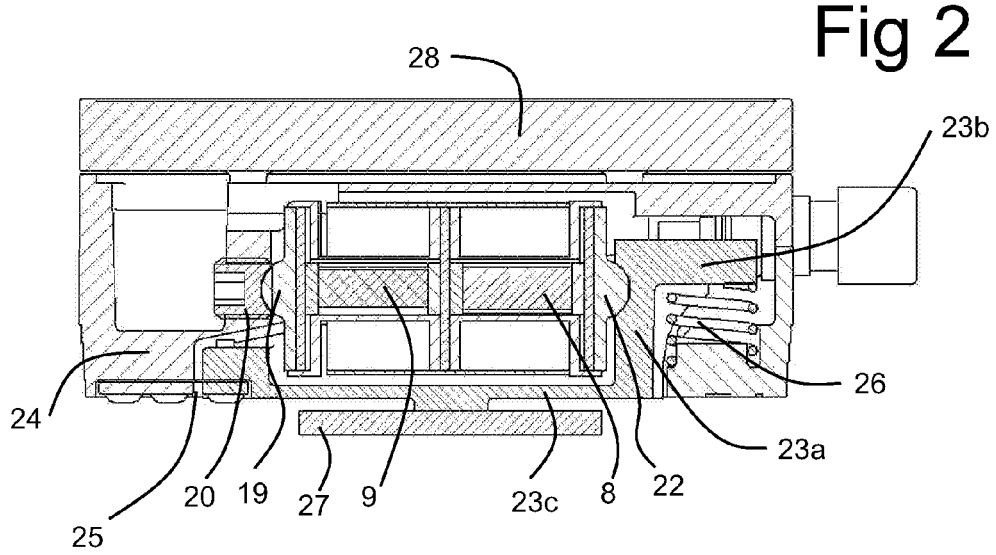
FIG. 2 is a cross-sectional elevation through an actuator according to a second embodiment.

FIG. 2 shows a low-profile alternative construction, in which the structure of the bobbin assembly is essentially identical with that shown in FIG. 1, corresponding components being numbered with the same reference numerals. In this case, the assembly has a second end-piece 22, at the opposite end to the first end-piece 19, engaging a lever 23 mounted within a body 24. The lever 23 has a central portion 23a engaged by the end-piece 22, a first arm 23b extending at right angles to the central portion at one end thereof, and a second arm 23c extending from the opposite end of the central portion parallel to the first arm but on the other side of the central portion. The first arm 23b is connected to the body by means of a resilient plate 25 is biased by a spring 26, while the second arm 23c carries the foot 27 which couples the vibrations into the surface to be excited. The lever enables the driver assembly to be located with its longitudinal axis parallel to the surface which the actuator is located, and may also be used to magnify the amplitude of vibration at the foot. The body 24 carries a weight 28 on the opposite side from the foot, to load the foot and so enhance signal coupling.

Figure 3:
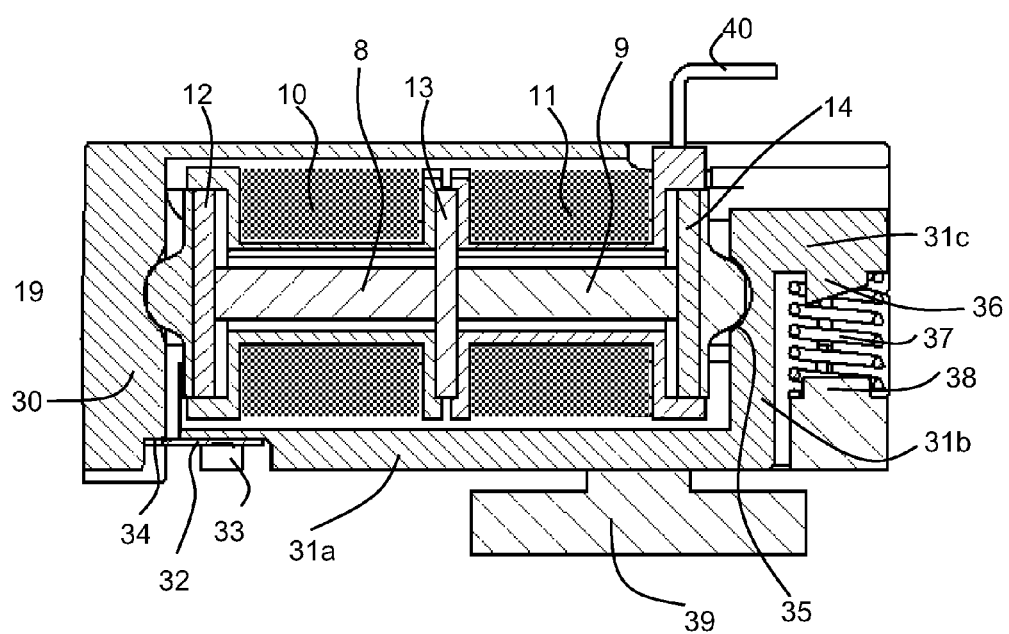
FIG. 3 is a cross-sectional elevation through an actuator which is an alternative embodiment to that shown in FIG. 2.

In the embodiment of FIG. 3, the bobbin assembly is essentially identical with that of FIG. 2, although it omits the spacers 15-18, and is mounted between a solid end 30 of the body of the actuator and a lever 31 which is secured to the end 30 by means of a hinge 32 in the form of a resiliently bendable plate having holes therethrough which fit over crimpable posts 33 on the end of the main arm 31a of the lever 31. Crimping of the posts 33 secures the hinge 32 in position. The hinge 32 has at its other end two toothed tabs 34 which fit into channels in the end 30 of the body, the sides of the channel then being crimped to secure the hinge in the body. The lever 31 has a middle portion 31b at right angles to the main arm 31a, and the end of the bobbin assembly engages in a depression 35 in the middle portion 31b. A final portion 31c of the lever extends at right angles to the end of the middle portion and parallel to the main arm 31a and has a locating post 36 to receive the end of a helical spring 37, the other end of which locates on a post 38 on the body. The main arm 31a carries a foot 39 to engage on and couple vibrations into a surface, for example a ceiling panel. A signal cable connector 40 provides the connections to the coils 10 and 11. In assembling the actuator, the coil assembly and lever are held with the correct pre-stress during crimping of the hinge mounts, the crimping of the hinge mounts thus holding the lever in a position wherein the desired pre-stress is maintained after fixing. In this way, there is no need for adjusting the pre-stressing by an individually adjustable screw, thereby substantially simplifying manufacture and so reducing costs.

It has been found that by varying the position of the foot on the actuator, the frequency response can be modified. The foot 39 is therefore adjustably mounted on the arm 31a.

The invention claimed is:

1. A magnetostrictive actuator comprising an assembly of at least two GMM rods spaced apart from each other on the same longitudinal axis, each GMM rod being surrounded by a respective energizing electromagnetic coil and being mounted between respective biasing permanent magnets, the assembly being mounted between a mechanical pre-stressing mechanism and a foot adapted to couple forces produced by the actuator into a solid surface, the foot of the assembly engaging a lever connected to the foot, whereby the forces may be applied by the foot in a direction oblique to, or at right-angles to, the said longitudinal axis.

2. A magnetostrictive actuator according to claim 1, further comprising a non-magnetic spacer at each end of each GMM rod between the GMM rod and the adjacent biasing permanent magnet.

3. A magnetostrictive actuator according to claim 1, wherein each GMM rod has a non-circular cross-section.

4. A magnetostrictive actuator according to claim 3, wherein each GMM rod has a rectangular cross-section.

5. A magnetostrictive actuator according to claim 1, wherein each GMM rod has a length of less than 20 mm.

6. A magnetostrictive actuator according to claim 1, wherein each GMM rod is surrounded by more than one energizing electromagnetic coil.

7. A magnetostrictive actuator according to claim 6, wherein some of the energizing electromagnetic coils are connected in series and some of the energizing electromagnetic coils are connected in parallel.

8. A magnetostrictive actuator according to claim 1, wherein the energizing electromagnetic coils are connected in series.

9. A magnetostrictive actuator according to claim 1, wherein the energizing electromagnetic coils are connected in parallel.

10. A magnetostrictive actuator according to claim 1, wherein the lever is mounted by means of a resiliently bendable flat hinge plate to a body surrounding at least a portion of the magnetostrictive actuator.

11. A magnetostrictive actuator according to claim 10, wherein the hinge plate is adjustably attachable to the body, and whereby a pre-stressing load can be applied to the coil and rod assembly during attachment of the hinge plate to the body, such that a pre-stress is maintained by the mounting position of the plate.

12. A magnetostrictive actuator according to claim 1, wherein the mechanical pre-stressing mechanism comprises a screw engaging an end of the assembly.

13. A magnetostrictive actuator according to claim 1, wherein the mechanical pre-stressing mechanism comprises a spring.

14. A magnetostrictive actuator according to claim 1, wherein a common biasing magnet is located between at least one adjacent pair of rods.

\* \* \* \* \*